（12） United States Patent
Yang et al.

(10) Patent No.: US 10,714,562 B2
(45) Date of Patent: Jul. 14, 2020

(54) DISPLAY PANEL AND DISPLAY DEVICE

(71) Applicants: BOE Technology Group Co., Ltd., Beijing (CN); Chengdu BOE Optoelectronics Technology Co., Ltd., Chengdu, Sichuan (CN)

(72) Inventors: Shuquan Yang, Beijing (CN); Zhifeng Zhan, Beijing (CN); Peng Huang, Beijing (CN); Yanxin Wang, Beijing (CN)

(73) Assignees: BOE Technology Group Co., Ltd., Beijing (CN); Chengdu BOE Optoelectronics Technology Co., Ltd., Chengdu (CN)

(*) Notice: Subject to any disclaimer, the term of this patent is extended or adjusted under 35 U.S.C. 154(b) by 0 days.

(21) Appl. No.: 16/108,993

(22) Filed: Aug. 22, 2018

(65) Prior Publication Data
US 2019/0206968 A1  Jul. 4, 2019

(30) Foreign Application Priority Data
Jan. 4, 2018  (CN) .......................... 2018 1 0007457

(51) Int. Cl.
*H01L 27/32* (2006.01)
*G09F 9/30* (2006.01)
*H01L 51/00* (2006.01)
*H01L 51/52* (2006.01)

(52) U.S. Cl.
CPC .......... *H01L 27/3276* (2013.01); *G09F 9/301* (2013.01); *H01L 27/3258* (2013.01); *H01L 51/0097* (2013.01); *H01L 51/5253* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 2015/0102298 A1* | 4/2015 | Namkung | H01L 51/0097 257/40 |
| 2017/0278899 A1* | 9/2017 | Yang | H01L 51/0097 |
| 2017/0302772 A1* | 10/2017 | Zhang | H01L 51/56 |

* cited by examiner

*Primary Examiner* — Deeprose Subedi
(74) *Attorney, Agent, or Firm* — Arent Fox LLP; Michael Fainberg (57) ABSTRACT

The disclosure discloses a display panel and a display device, and the display panel includes: a display area, a wiring area, and a bending area connecting the display area and the wiring area. The bending area includes first edges and second edges; the first edges are edges at which the bending area is connected with the display area or the wiring area, and the second edges are other edges of the bending area than the first edges; and at least one of the second edges includes an inflexion at which the second edge is concaved toward the inside of the bending area.

16 Claims, 6 Drawing Sheets

DISPLAY PANEL AND DISPLAY DEVICE

CROSS-REFERENCES TO RELATED APPLICATIONS

This application claims priority to Chinese patent application No. 201810007457.3 filed on Jan. 4, 2018, which is incorporated herein by reference in its entirety.

FIELD

The present disclosure relates to the field of display technologies, and particularly to a display panel and a display device.

BACKGROUND

As the display technologies are advancing, they have been increasingly widely applied, and particularly Organic Light-Emitting Diode (OLED) displays have been widely applied due to their advantages of self-illumination, a high response speed, a wide angle of view, high brightness, high salutation, a low weight, a small thickness, etc.

SUMMARY

An embodiment of the disclosure provides a display panel including: a display area, a wiring area, and a bending area connecting the display area and the wiring area, wherein: the bending area includes first edges and second edges; the first edges are edges at which the bending area is connected with the display area or the wiring area, and the second edges are other edges of the bending area than the first edges; and at least one of the second edges includes an inflexion at which the second edge is concaved toward the inside of the bending area.

In a possible implementation, in the display panel above according to the embodiment of the disclosure, both of two second edges of the bending area include inflexions.

In a possible implementation, in the display panel above according to the embodiment of the disclosure, the two second edges of the bending area are symmetric about a first central axis of the bending area.

In a possible implementation, in the display panel above according to the embodiment of the disclosure, each of the second edges includes one inflexion lying on a second central axis of the bending area, and the second central axis is perpendicular to the first central axis.

In a possible implementation, in the display panel above according to the embodiment of the disclosure, each of the two second edges of the bending area is symmetric about the second central axis of the bending area.

In a possible implementation, in the display panel above according to the embodiment of the disclosure, two second edges of the bending area are arcs, folded lines, or curves consisted of connected arcs and folded lines.

In a possible implementation, in the display panel above according to the embodiment of the disclosure, a buffer layer is arranged on a display surface of the display panel, and a protection layer is arranged on a surface of the display panel away from the display surface; and a positive projection of the buffer layer onto the display panel has an overlapping area with the bending area, the protection layer includes a groove structure, and a positive projection of the groove structure onto the display panel lies within the bending area.

In a possible implementation, in the display panel above according to the embodiment of the disclosure, a buffer structure is arranged on the buffer layer to buffer a bending stress in the bending area.

In a possible implementation, in the display panel above according to the embodiment of the disclosure, the display panel is a flexible display panel.

An embodiment of the disclosure further provides a display device including a display panel. The display panel includes a display area, a wiring area, and a bending area connecting the display area and the wiring area; wherein the bending area includes first edges and second edges; the first edges are edges at which the bending area is connected with the display area or the wiring area, and the second edges are other edges of the bending area than the first edges; and at least one of the second edges includes an inflexion at which the second edge is concaved toward the inside of the bending area.

In a possible implementation, in the display device above according to the embodiment of the disclosure, both of two second edges of the bending area include inflexions.

In a possible implementation, in the display device above according to the embodiment of the disclosure, the two second edges of the bending area are symmetric about a first central axis of the bending area.

In a possible implementation, in the display device above according to the embodiment of the disclosure, each of the second edges includes one inflexion lying on a second central axis of the bending area, and the second central axis is perpendicular to the first central axis.

In a possible implementation, in the display device above according to the embodiment of the disclosure, each of the two second edges of the bending area is symmetric about the second central axis of the bending area.

In a possible implementation, in the display device above according to the embodiment of the disclosure, two second edges of the bending area are arcs, folded lines, or curves consisted of connected arcs and folded lines.

In a possible implementation, in the display device above according to the embodiment of the disclosure, a buffer layer is arranged on a display surface of the display panel, and a protection layer is arranged on a surface of the display panel away from the display surface; and a positive projection of the buffer layer onto the display panel has an overlapping area with the bending area, the protection layer includes a groove structure, and a positive projection of the groove structure onto the display panel lies within the bending area.

In a possible implementation, in the display device above according to the embodiment of the disclosure, a buffer structure is arranged on the buffer layer to buffer a bending stress in the bending area.

In a possible implementation, in the display device above according to the embodiment of the disclosure, the display panel is a flexible display panel.

DETAILED DESCRIPTION

Specific implementations of the display panel and the display device according to the embodiments of the disclosure will be described below in details with reference to the drawings. The thicknesses and shapes of respective layers in the drawings are not intended to reflect any real proportion, but only intended to illustrate the content of the disclosure.

Figure 1A:
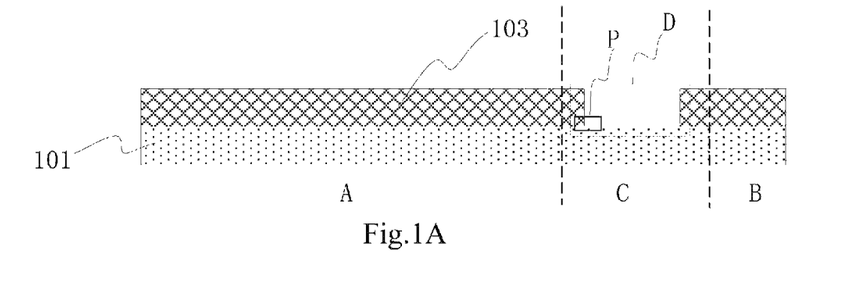
FIG. 1A is a schematic sectional view of a display panel before being bent in the related art.

As illustrated in FIG. 1A, a display area A and a wiring area B are arranged on a polyimide (PI) substrate of an OLED display, the wiring area B has a larger width. In order to satisfy a demand for all screen display without any bezel or with a narrow bezel, the wiring area B can be folded to behind the display area to thereby reduce the width of the bezel. A bending area C can be arranged between the display area A and the wiring area B for the wiring area B to be folded to behind the display area, but a stress during bending is so significant that metal lines in the bending area tend to be broken.

Referring to FIG. 1A again, a protection layer 103 is arranged on a surface of a display panel 101 of the OLED display away from a display surface thereof, and the protection layer 103 is structured as a groove at the position thereof corresponding to the bending area C, i.e., the structure as denoted in the dotted box D. The metal lines in the bending area C are broken primarily because the material of the protection layer 103 is typically more rigid than the material of a substrate of the display panel 101, and during bending, a bending center tends to occur at the edge of the groove structure D of the protection layer 103, i.e., the position as denoted in the box P, and the display panel 101 and the protection layer 103 are extruded against each other so that the stress is concentrated there, and thus the metal lines in the bending area C may be subjected to the significant stress from the protection layer 103, and consequently broken.

In view of the problem of the related art that the metal lines in the bending area tend to be broken while the display panel is being bent, the embodiments of the disclosure provide a display panel and a display device.

Figure 1B:
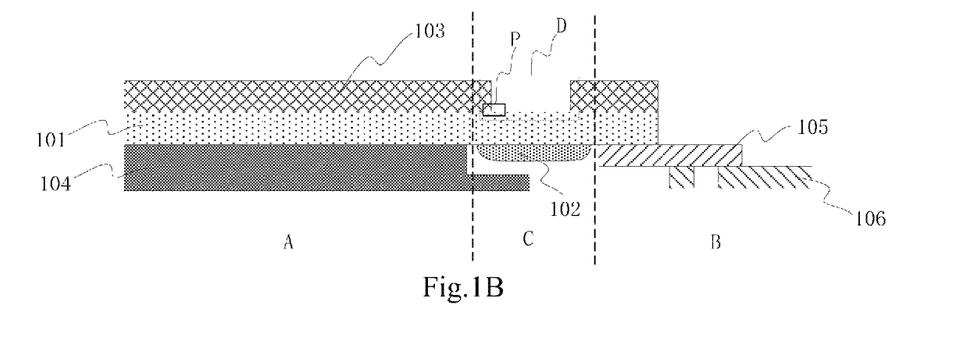
FIG. 1B and FIG. 1C are schematic sectional views of the display panel before being bent according to the embodiment of the disclosure.

In one aspect, an embodiment of the disclosure provides a display panel as illustrated in FIG. 1B, which includes: a display area A, a wiring area B, and a bending area C connecting the display area A and the wiring area B.

Figure 3A:
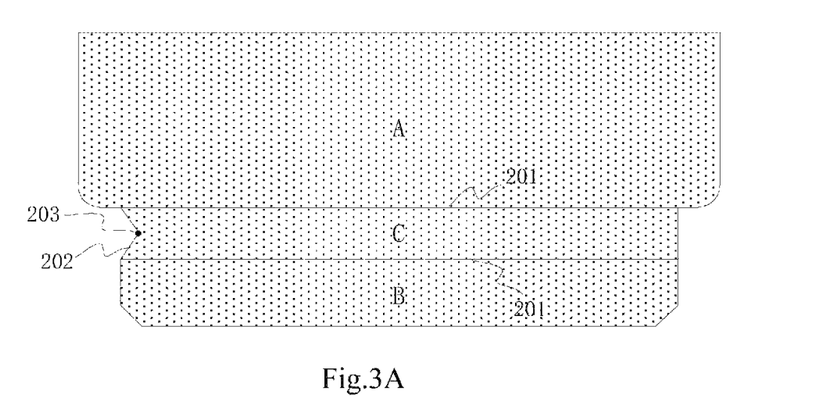
FIG. 3A to FIG. 3G are schematic top views of the display panel according to the embodiment of the disclosure.

Also referring to FIG. 3A, the bending area C includes first edges 201 and second edges 202.

The first edges 201 are edges at which the bending area C is connected with the display area A or the wiring area B, and the second edges 202 are other edges of the bending area C than the first edges 201.

At least one of the second edges 202 includes an inflexion 203 at which the second edge 202 is concaved toward the inside of the bending area C.

In the display panel according to the embodiment of the disclosure, the at least one second edge of the bending area includes the inflexion at which the second edge is concaved toward the inside of the bending area, so the bending area has a smaller width at the inflexion (the width direction of the bending area is the extension direction of the first edge 201), and the bending area is subjected to a higher stress at the inflexion during bending, so that a bending center tends to occur at the inflexion instead of occurring at the boundary of a protection layer, so metal lines in the bending area can be alleviated from a stress from the protection layer during bending, and thus avoided from being broken.

As illustrated in FIG. 1B, the wiring area B of the display panel generally includes various circuit structures, e.g., an integrated chip 105, a Flexible Printed Circuit (FPC) 106, etc., as illustrated, where the integrated chip 105 is bonded on the flexible printed circuit 106 using the Chip on FPC (COF) technology. In a specific implementation, the wiring area B can further include other circuit structures, although they will not be enumerated here. The bending area C may include a plurality of connection lines to connect signal lines in the display area A with the circuit structures in the wiring area B, or some circuit structures may be arranged in the bending area C, although the structures in the wiring area B and the bending area C will not be limited to any specific structures. In a real application, the length of the second edge 202 typically ranges from 1 mm to 3 mm, and apparently the interval (i.e., the bending area) between the display area and the wiring area is very small, so the success ratio of bending can be improved by controlling the bending center precisely.

In some embodiments of the disclosure, the display panel may be an OLED display panel, or may be another display panel, e.g., a liquid crystal display panel, electronic paper, etc., as long as it can be bent. As illustrated in FIG. 1B, the side of the display panel 101 proximate to a cover plate 104 is a display surface, and a protection layer 103 is arranged on the other side of the display panel 101 to protect and support it. A groove structure D is arranged at the protection layer 103 in the bending area C, and the groove structure D may or may not run through the protection layer 103, although the embodiment of the disclosure will not be limited thereto. Moreover a polarizing layer, a touch layer, or another structure may be further arranged on the display face of the display panel 101, although the embodiment of the disclosure will not be limited thereto.

In some embodiments, as illustrated in FIG. 1B, the groove structure D may run through the protection layer 103, that is, the protection layer 103 is separated by the groove structure D.

Figure 1C:
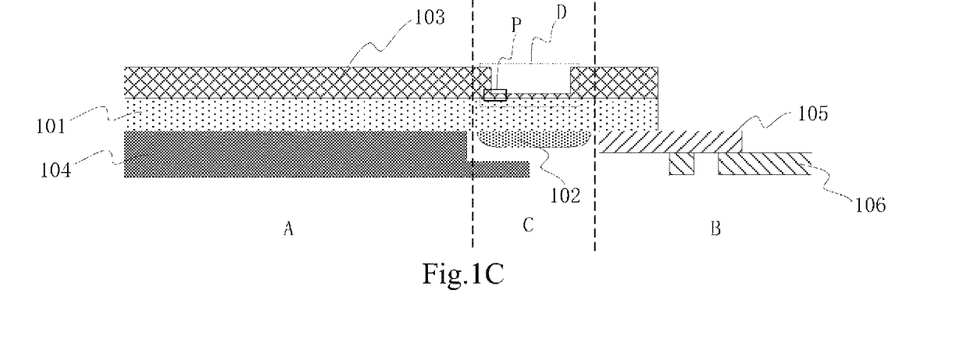

In some embodiments, as illustrated in FIG. 1C, the groove structure D may not run through the protection layer 103, that is, the protection layer 103 is continuous layer, and the thickness thereof on the bending area is smaller than the thickness thereof on the display area and the wiring area. The display panel as illustrated in FIG. 1C is similar as the display panel as illustrated in FIG. 1B, the difference is merely that the depth of the groove structure is different, a repeated description thereof will be omitted here.

Figure 2A:
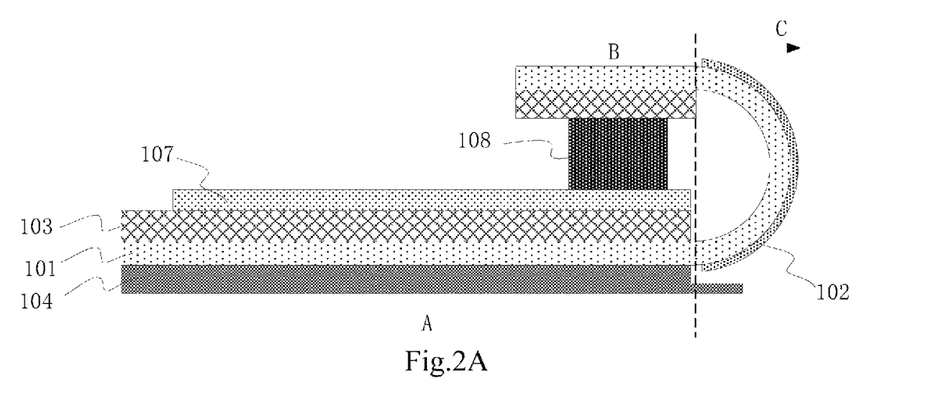
FIG. 2A and FIG. 2B are schematic sectional views of the display panel after being bent according to the embodiment of the disclosure.
Figure 2B:
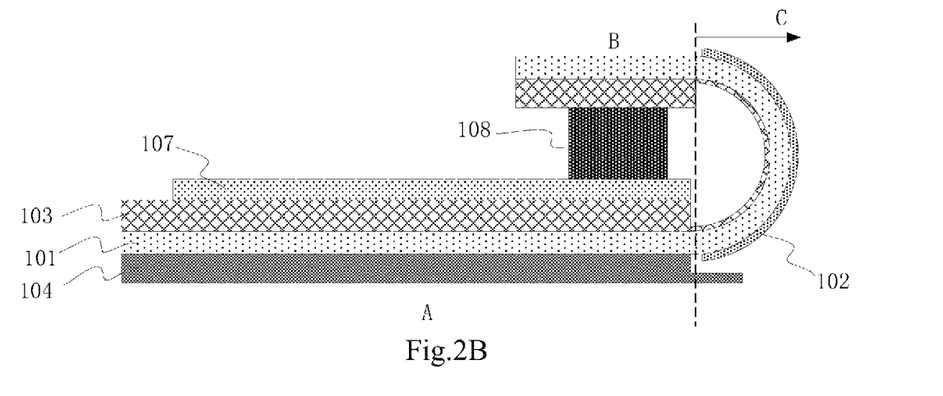

It shall be noted that the display panel above according to the embodiment of the disclosure may be the display panel before being bent as illustrated in FIG. 1B or FIG. 1C, or may be the display panel after being bent as illustrated in FIG. 2A or FIG. 2B, the state of the display panel will not be limited here. The display panel above according to the embodiment of the disclosure is a flexible display panel, but can alternatively be another display panel in a specific embodiment, although the type of the display panel will not be limited here.

FIG. 3A to FIG. 3G are schematic top views of the display panel as illustrated in FIG. 1B, where the sizes of respective areas as illustrated are not intended to reflect any real size, but only intended to illustrate the structures in the bending area. As illustrated in FIG. 3A, the bending area C includes two first edges 201 and two second edges 202, where the first edges 201 are edges at which the bending area C is connected with the display area A or the wiring area B, and the second edges 202 are other edges of the bending area C than the first edges 201. That is, the first edge 201 is an edge between the bending area C and the display area A, or an edge between the bending area C and the wiring area B. The second edges 202 are edges at which the bending area C has only one intersection with the display area A or the wiring area B. At least one second edge 202 includes an inflexion 203 at which the second edge 202 is concaved toward the inside of the bending area C. In the embodiment of the disclosure, the inflexion may refer to a point of a curve at which the curve is changed from being concave to being convex or from being convex to being concave, or a point of a curve at which the bending direction of the curve is changed. Since the second edge 202 is concaved toward the inside of the bending area C at the inflexion 203, the bending area C has a smaller width at the inflexion 203, or in some cases, the bending area has the smallest width at the inflexion. For example, when the second edge 202 includes only one inflexion 203, the bending area C has the smallest width at the inflexion 203 as illustrated in FIG. 3A (in the disclosure, the width direction of the bending area C is the extension direction of the first edge 201), so the bending area is subjected to a higher stress at the inflexion 203 during bending, and thus a bending center axis tends to occur at the inflexion instead of occurring at the boundary of the protection layer, so metal lines in the bending area can be alleviated from a stress from the protection layer during bending, and thus avoided from being broken, thus improving the success ratio of bending the display panel, and a yield ratio of the product.

FIG. 2A and FIG. 2B illustrate the display panel after being bent. After the display panel is bent, two components of the protection layer 103 can be bonded together using a support structure 108, that is, the support structure 108 functions to bond and support it. Moreover in order to improve the performance of heat dissipation in the display panel, a heat dissipation layer 107 may be further arranged between the protection layer 103 and the support structure 108.

Figure 3B:
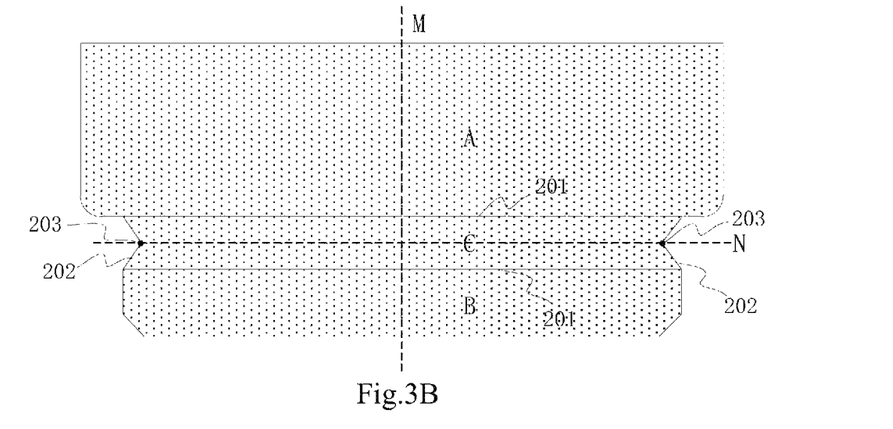
Figure 3C:
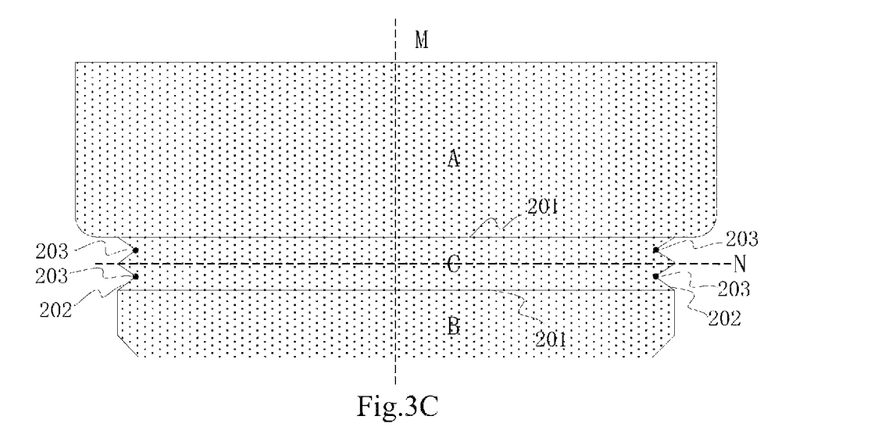

In some embodiments, in the display panel above, as illustrated in FIG. 3B, both of the two second edges 202 of the bending area C include inflexions 203. FIG. 3B illustrates the second edges 202 each including only one inflexion 203 by way of an example, but each second edge 202 alternatively includes a plurality of inflexions 203 in a specific implementation. For example, each second edge 202 may include two inflexions 203 as illustrated in FIG. 3C, or each second edge may alternatively include more inflexions, or the two second edges may include different numbers of inflexions, although they will not be enumerated here. Both of the two second edges 202 of the bending area C are arranged with the inflexions 203 to thereby further reduce the width thereof at the inflexions 203 so as to make it easier for bending center axis to occur at the inflexions 203, thus improving the success ratio of bending the display panel.

In some embodiments, in the display panel above, the two second edges 202 of the bending area C are symmetric about a first central axis M of the bending area C as illustrated in FIG. 3B and FIG. 3C. Since the two second edges 202 are symmetric about the dotted line M, the numbers of inflexions 203 on the two second edges 203 are the same, and the positions of two inflexions 203 symmetric about the dotted line M correspond to each other, thus making it easier for bending center axis to occur at the inflexions 203. Furthermore the central axis of the wiring area B after the display panel is bent is parallel to the central axis thereof before the display panel is bent, that is, the wiring area B will not be displaced from the original central axis during bending, or the bending area C can be bent symmetrically more easily to thereby further improve the success ratio of bending.

In a real application, in the display panel above according to the embodiment of the disclosure, as illustrated in FIG. 3B, FIG. 3D, FIG. 3E, FIG. 3F, and FIG. 3G, each second edge 202 includes one inflexion 203 lies in a second central axis (i.e., the dotted line N) of the bending area C, where the second central axis is perpendicular to the first central axis. Thus the bending area C has a smaller width on the dotted line N, and when each second edge 202 includes only one inflexion 203, the bending area C has the smallest width on the dotted line N, and when each second edge 202 includes a plurality of inflexions, the inflexion 203 on the dotted line N may be arranged to be more proximate to the inside of the bending area C, so that the bending area C has the smallest width on the dotted line N. In this way, the bending area C has the smallest width at the second central axis N, and a bending center axis tends to occur on the second central axis N, so that a stress in the bending area can be made more uniform, and the metal lines in the bending area C will not be broken easily, thus further improving the success ratio of bending.

Figure 3D:
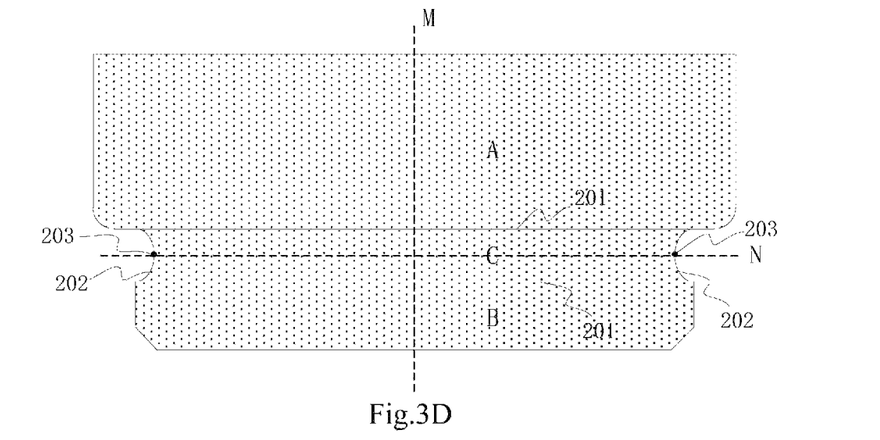
Figure 3E:
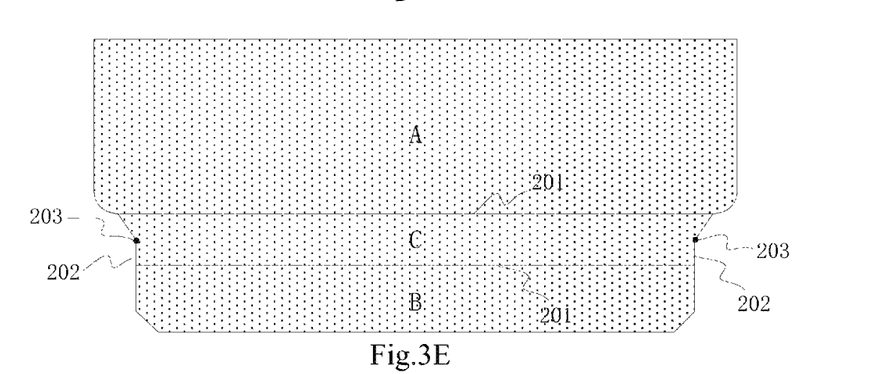
Figure 3F:
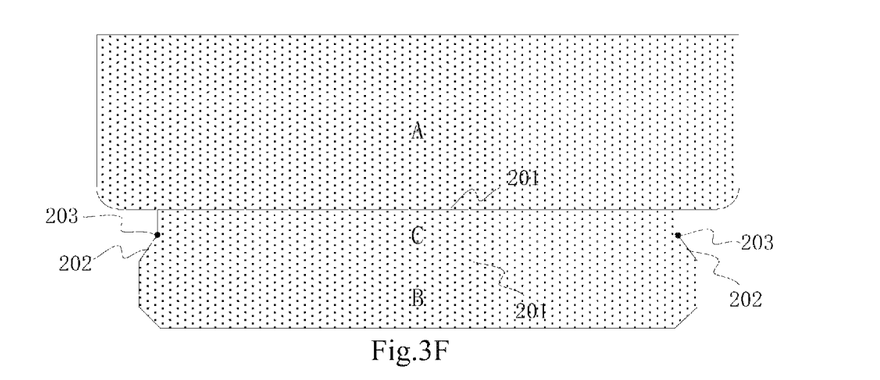

In a specific implementation, in the display panel above according to the embodiment of the disclosure, as illustrated in FIG. 3B and FIG. 3D, each of the two second edges 202 of the bending area C is symmetric about the second central axis (i.e., the dotted line N as illustrated) of the bending area C, so that an odd number of inflexions 203 may be arranged at each second edge 202, so that one of the inflexions 203 at each second edge 202 lies on the dotted line N, and since the shape of the bending area C is uniform, there is such a uniform stress in the bending area C other than the inflexions that bending center axis tends to occur on the second central axis of the bending area C during bending, so the bending center axis can be controlled precisely on the second central axis of the bending area C to thereby control the bending precisely.

Figure 3G:
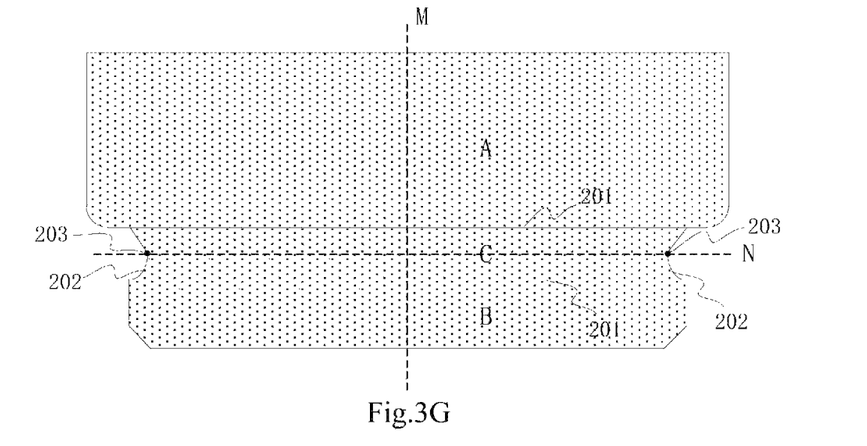

Specifically in the display panel above according to the embodiment of the disclosure, the two second edges 202 of the bending area C are arcs (as illustrated in FIG. 3D), folded lines (as illustrated in FIG. 3A to FIG. 3C), or curves consisted of connected arcs and folded lines (as illustrated in FIG. 3G). FIG. 3A to FIG. 3G only illustrate the second edges 202 each including one or two inflexions 203 by way of an example, but the second edges 202 each may alternatively include more inflexions 203 in a specific implementation, although the number of inflexions 203 will not be limited thereto in the embodiment of the disclosure.

Specifically in the display panel above according to the embodiment of the disclosure, as illustrated in FIG. 1B and FIG. 2A, a buffer layer 102 is arranged on the display surface side of the display panel 101, and a protection layer 102 is arranged on the side of the display panel away from the display surface.

A positive projection of the buffer layer 102 onto the display panel 101 has an overlapping area with the bending area C, the protection layer 103 includes a groove structure (as denoted in the dotted box D in FIG. 1B), and a positive projection of the groove structure D onto the display panel 101 lies within the bending area C.

In the embodiment of the disclosure, the buffer layer 102 is arranged on the display surface side of the display panel 101, and the positive projection of the buffer layer 102 onto the display panel 101 has an overlapping area with the bending area C. In some embodiments, the positive projection of the buffer layer 102 lies within the bending area C, or the positive projection of the buffer layer 102 overlies the entire bending area C, although the pattern of the buffer layer 102 will not be limited thereto. The buffer layer 102 is located on the display surface of the display panel 101, and may function to release a stress on the display panel 101 being bent in the bending area C to thereby improve the success ratio of bending, and avoiding the lines in the bending area C from being broken. In a real application, the buffer layer 102 may be made of a colloidal material or a resin material, although the embodiment of the disclosure will not be limited thereto.

Moreover the protection layer is arranged on the side of the display panel 101 away from the display surface, and may function to protect and support the display panel 101, and the groove structure is arranged at the protection layer 103 at the position thereof corresponding to the bending area C, so that the thickness of the bending area C can be reduced to thereby lower a stress in the bending area C. As illustrated in FIG. 2A and FIG. 2B, the two components of the bent protection layer 103 segmented by the groove structure are bonded using the support structure 108. In a specific implementation, the groove structure D may or may not run through the protection layer 103. As illustrated in FIG. 2A, the groove structure runs through the protection layer 103, that is the protection layer 103 is separated by the groove structure. As illustrated in FIG. 2B, the groove structure doesn't run through the protection layer 103, that is, the protection layer 103 is continuous, the thickness of the protection layer 103 on the bending area is smaller than the thickness of the protection layer 103 on the display area and the wiring area. The depth of the groove structure can typically range from 100 μm to 200 μm, although the embodiment of the disclosure will not be limited thereto.

Figure 4A:
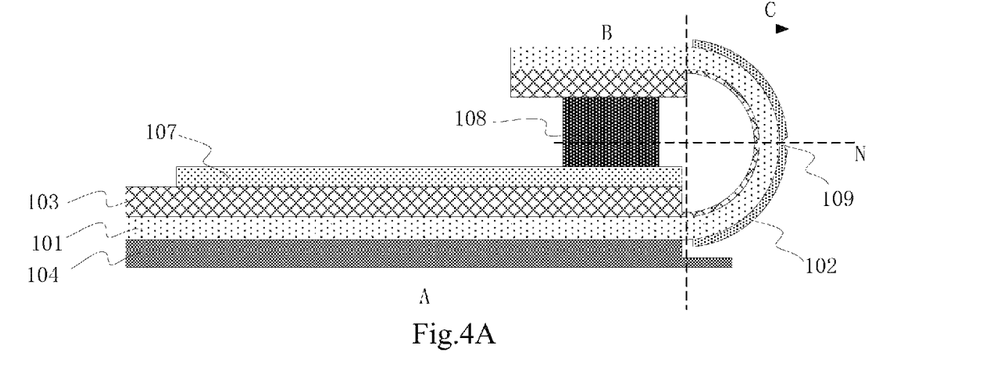
FIG. 4A and FIG. 4B are schematic sectional views of the display panel including a buffer structure according to the embodiment of the disclosure.
Figure 4B:
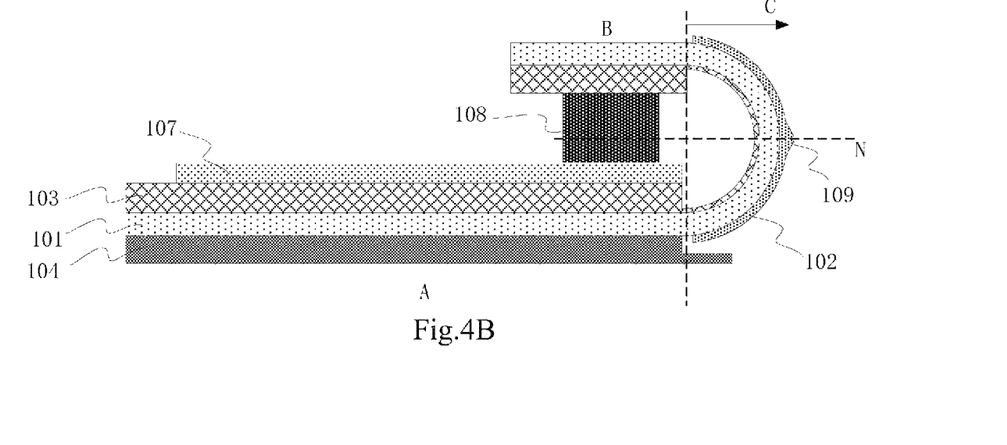

In some embodiments, in the display panel above, a buffer structure 109 is arranged on the buffer layer 102 to buffer a bending stress in the bending area as illustrated in FIG. 4A and FIG. 4B.

The buffer structure 109 is arranged on the buffer layer 102 so that a part of a stress produced in the bending area C may be transmitted to the buffer layer 109 and released at the buffer layer 109 while the display panel 101 is being bent, to thereby avoid the metal lines in the bending area C from being broken due to the stress being concentrated therein, so as to improve the success ratio of bending. Moreover the buffer structure 109 may be arranged on the second central axis N of the bending area C to thereby further facilitate symmetric bending of the bending area C so as to further improve the success ratio of bending.

Specifically the buffer structure 109 may be a groove formed in the buffer layer 102 as illustrated in FIG. 4A, or may be a protrusion formed on the buffer layer 102 as illustrated in FIG. 4B, or may be another stress-releasing structure, although the embodiment of the disclosure will not be limited thereto.

In another aspect, based upon the same inventive idea, an embodiment of the disclosure further provides a bending method of the display panel above. Since the bending method addresses the problem under a similar principle to the display panel above, reference may be made to the implementation of the display panel above for an implementation of the bending method, and a repeated description thereof will be omitted here.

Figure 5:
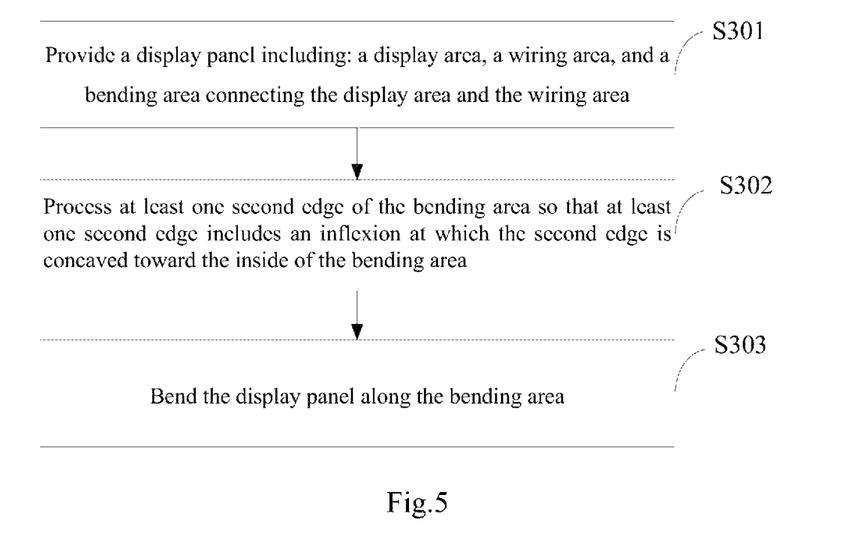
FIG. 5 is a flow chart of a method for bending a display panel according to an embodiment of the disclosure.

As illustrated in FIG. 5, a bending method of the display panel above according to an embodiment of the disclosure includes the following steps.

The step S301 is to provide a display panel 101. As illustrated in FIG. 1B and FIG. 1C, the display panel 101 includes: a display area A, a wiring area B, and a bending area C connecting the display area A and the wiring area B.

The step S302 is to process at least one second edge of the bending area C so that at least one second edge 202 includes an inflexion 203 at which the second edge 202 is concaved toward the inside of the bending area C as illustrated in FIG. 3A to FIG. 3G.

The step S303 is to bend the display panel 101 along the bending area, where the bent display panel 101 is as illustrated in FIG. 2A and FIG. 2B.

In the bending method of a display panel according to the embodiment of the disclosure, the second edge of the bending area is processed so that the at least one second edge includes the inflexion at which the second edge is concaved toward the inside of the bending area. Thus the bending area has a smaller width at the inflexion, and subjected to a higher stress at the inflexion during bending, so that a bending center axis tends to occur at the inflexion instead of occurring at the boundary of a protection layer, so metal lines in the bending area can be alleviated from a stress from the protection layer during bending, and thus avoided from being broken.

Since a bending process is the last process in production of a display, a production cost may be greatly increased due to a defect occurring in the bending process. In the bending method according to the embodiment of the disclosure, the second edge of the bending area may be processed to thereby improve the success ratio of bending, and the inflexion may be arranged to thereby control precisely the bending center axis during bending so as to improve the precision of alignment in bending, thus improving the robustness of the display to bending.

Specifically in the bending method above according to the embodiment of the disclosure, the second edge of the bending area may be processed in the step S302 as follows. The second edge of the bending area is processed in a laser cutting or die cutting process.

Figure 6:
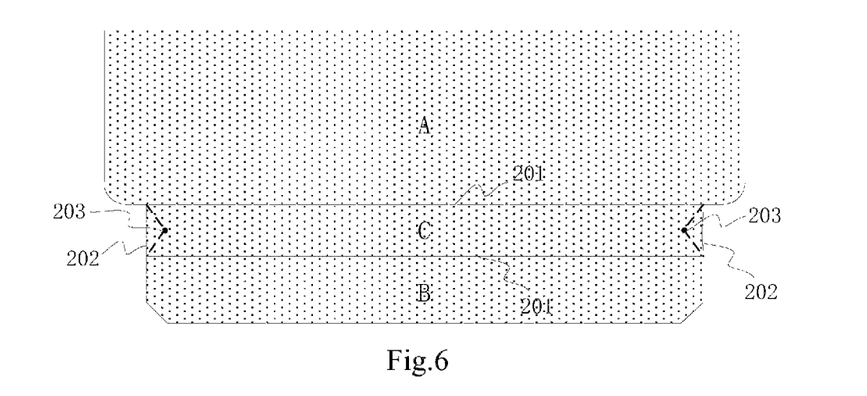
FIG. 6 is a schematic top view of a second edge of a bending area which is processed in the bending method according to the embodiment of the disclosure.

In a real application, the position of the inflexion may be reserved in a design of a wiring layout in the wiring area and the bending area to thereby facilitate processing of the second edge in the step S302. As illustrated in FIG. 6, in order to form the layout as illustrated in FIG. 3B, for example, the inflexions 203 are to be formed at the black points in FIG. 6, so areas from the black points to the second edges are reserved in a design of the wiring layout, that is, the metal lines are arranged on the sides of the black points proximate to the inside of the bending area C, so that the areas from the black points to the second edges can be cut without affecting the metal lines. Specifically the respective layers in the bending area C may be cut from the dotted lines to the second edges in FIG. 6 by the laser cutting or die cutting process. The laser cutting process may be performed using a UV pico laser or Femto laser, and appropriate processing power, an appropriate pulse frequency, or an appropriate processing speed may be adjusted to thereby cut precisely the respective layers in the bending area while narrowing a heat effect area arising from laser cutting. Moreover the die cutting process may be performed to thereby lower a cost of cutting the bending area, or another cutting process may be performed, although the embodiment of the disclosure will not be limited thereto.

In some embodiments, in the bending method above, the two second edges of the bending area are symmetric about the first central axis of the bending area.

The display panel is bent in the bending area in the step S303 above as follows.

The display panel is bent with the inflexions at the two second edges of the bending area being bending center.

Taking the structure as illustrated in FIG. 3B as an example, the two second edges of the bending area C are symmetric about the dotted line M, so the numbers of inflexions 203 at the two second edges 202 are the same, and the positions of two inflexions 203 symmetric about the dotted line M correspond to each other, so that bending center tends to occur on a line connecting the two corresponding inflexions 203, and the line connecting the two corresponding inflexions 203 is parallel to the dotted line N. In this way, the bending centers can be positioned directly at the positions of the inflexions in the step S303 to thereby improve the success ratio of bending while the position of the bending area will not be displaced after being bent.

In some embodiments, in the bending method above, each second edge includes one inflexion locating on the second central axis of the bending area.

The display panel is bent in the bending area in the step S303 above as follows.

The display panel is bent with the second central axis of the bending area being a bending center line.

Referring to the structure as illustrated in FIG. 3B again, since each second edge 202 has one inflexion locating on the dotted line N, the dotted line N may be a bending center line in the step S303. Thus symmetric bending may be made to thereby lower a risk of the metal lines being broken, so as to improve the success ratio of bending.

In another aspect, based upon the same inventive idea, an embodiment of the disclosure further provides a display device including the display panel above. The display device may be applicable to a mobile phone, a tablet computer, a TV set, a monitor, a notebook computer, a digital photo frame, a navigator, or any other product or component with a display function. Since the display device addresses the problem under a similar principle to the display panel above, reference may be made to the implementation of the display panel above for an implementation of the display device, and a repeated description thereof will be omitted here.

In the display panel and the display device according to the embodiments of the disclosure, the at least one second edge of the bending area includes the inflexion at which the second edge is concaved toward the inside of the bending area, so the bending area has a smaller width at the inflexion, and subjected to a higher stress at the inflexion during bending. Therefore a bending center tends to occur at the inflexion instead of occurring at the boundary of a protection layer, so metal lines in the bending area may be alleviated from a stress from the protection layer during bending, and thus avoided from being broken.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
a substrate;
a display area, comprising a plurality of signal lines arranged on a first portion of the substrate;
a bending area, comprising a plurality of connection lines on a second portion of the substrate; and
a wiring area, comprising a plurality of circuit structures on a third portion of the substrate;
wherein the plurality of connection lines connects the plurality of signal lines and the plurality of circuit structures;
the second portion of the substrate comprises first edges and second edges;
the first edges are edges at which the second portion of the substrate is connected with the first portion of the substrate or the third portion of the substrate, and the second edges are other edges of the second portion of the substrate than the first edges; and
each of at least two second edges comprises at least one inflexion point, and each of the at least two second edges is concaved toward the inside of the bending area at the inflexion point;
wherein the orthographic projections of the plurality of connection lines on the second portion of the substrate are not overlap with the at least two second edges;
the at least two second edges are axial symmetric about a same axis of symmetry; and
the at least one inflexion point lies on same axis of symmetry.

2. The display panel according to claim 1, wherein the two second edges of the bending area are symmetric about a first central axis of the bending area.

3. The display panel according to claim 2, wherein each of the second edges comprises one inflexion lying on a second central axis of the bending area, and the second central axis is perpendicular to the first central axis.

4. The display panel according to claim 3, wherein each of the two second edges of the bending area is symmetric about the second central axis of the bending area.

5. The display panel according to claim 1, wherein two second edges of the bending area are arcs, folded lines, or curves consisted of connected arcs and folded lines.

6. The display panel according to claim 1, wherein a buffer layer is arranged on a display surface of the display panel, and a protection layer is arranged on a surface of the display panel away from the display surface; and
a positive projection of the buffer layer onto the display panel has an overlapping area with the bending area, the protection layer comprises a groove structure, and a positive projection of the groove structure onto the display panel lies within the bending area.

7. The display panel according to claim 6, wherein a buffer structure is arranged on the buffer layer to buffer a bending stress in the bending area.

8. The display panel according to claim 1, wherein the display panel is a flexible display panel.

9. A display device, comprising a display panel; wherein the display panel comprises:
a substrate;
a display area, comprising a plurality of signal lines arranged on a first portion of the substrate;
a bending area, comprising a plurality of connection lines on a second portion of the substrate; and
a wiring area, comprising a plurality of circuit structures on a third portion of the substrate;
wherein the plurality of connection lines connects the plurality of signal lines and the plurality of circuit structures;

the second portion of the substrate comprises first edges and second edges;

the first edges are edges at which the second portion of the substrate is connected with the first portion of the substrate or the third portion of the substrate, and the second edges are other edges of the second portion of the substrate than the first edges; and each of at least two second edges comprises at least one inflexion point, and each of the at least two second edges is concaved toward the inside of the bending area at the inflexion point;

wherein the orthographic projections of the plurality of connection lines on the second portion of the substrate are not overlap with the at least two second edges;

the at least two second edges are axial symmetric about a same axis of symmetry; and the at least one inflexion point lies on same axis of symmetry.

10. The display device according to claim 9, wherein the two second edges of the bending area are symmetric about a first central axis of the bending area.

11. The display device according to claim 10, wherein each of the second edges comprises one inflexion lying on a second central axis of the bending area, and the second central axis is perpendicular to the first central axis.

12. The display device according to claim 11, wherein each of the two second edges of the bending area is symmetric about the second central axis of the bending area.

13. The display device according to claim 9, wherein two second edges of the bending area are arcs, folded lines, or curves consisted of connected arcs and folded lines.

14. The display device according to claim 9, wherein a buffer layer is arranged on a display surface of the display panel, and a protection layer is arranged on a surface of the display panel away from the display surface; and a positive projection of the buffer layer onto the display panel has an overlapping area with the bending area, the protection layer comprises a groove structure, and a positive projection of the groove structure onto the display panel lies within the bending area.

15. The display device according to claim 14, wherein a buffer structure is arranged on the buffer layer to buffer a bending stress in the bending area.

16. The display device according to claim 9, wherein the display panel is a flexible display panel.

* * * * *